(12) United States Patent
Ma (10) Patent No.: US 11,632,880 B2
(45) Date of Patent: Apr. 18, 2023

(54) COOLING SYSTEM

(71) Applicant: BEIJING TUSEN ZHITU TECHNOLOGY CO., LTD., Beijing (CN)

(72) Inventor: Zhihua Ma, Beijing (CN)

(73) Assignee: BEIJING TUSEN ZHITU TECHNOLOGY CO., LTD., Beijing (CN)

( * ) Notice: Subject to any disclaimer, the term of this patent is extended or adjusted under 35 U.S.C. 154(b) by 3 days.

(21) Appl. No.: 17/217,817

(22) Filed: Mar. 30, 2021

(65) Prior Publication Data
US 2021/0219464 A1    Jul. 15, 2021

Related U.S. Application Data

(63) Continuation of application No. 16/242,845, filed on Jan. 8, 2019, now Pat. No. 10,973,152.

(30) Foreign Application Priority Data

Nov. 8, 2017    (CN) .......................... 201711088430.3

(51) Int. Cl.
*H05K 7/20*    (2006.01)

(52) U.S. Cl.
CPC ..... *H05K 7/20863* (2013.01); *H05K 7/20727* (2013.01); *H05K 7/20809* (2013.01); *H05K 7/20881* (2013.01)

(58) Field of Classification Search
CPC ......... H01L 23/427; H01L 23/40; G06F 1/20; G06F 2200/201; G06F 1/206;
(Continued)

(56) References Cited

U.S. PATENT DOCUMENTS

| 5,528,454 A | 6/1996 | Niklos |
| 5,949,646 A * | 9/1999 | Lee ...................... H05K 7/2019 |
| | | 165/104.34 |

(Continued)

FOREIGN PATENT DOCUMENTS

| CN | 201369011 Y | 12/2009 |
| CN | 204464810 U | 7/2015 |

(Continued)

OTHER PUBLICATIONS

Chinese Application No. 201711088430.3 Office Action dated Feb. 19, 2019.

*Primary Examiner* — Michael A Matey
(74) *Attorney, Agent, or Firm* — Paul Liu; Julie J. Muyco; Perkins Coie, LLP (57) ABSTRACT

The present disclosure provides a cooling system. The cooling system includes: a first set of fans mounted on an inward-facing side of an air inlet on an outer shell of a case; a second set of fans mounted on an inward-facing side of an air outlet on the outer shell of the case, for generating, in cooperation with the first set of fans, a high-pressure airflow from the air inlet to the air outlet; a first heat sink connected to heat generating component in the case, for absorbing heat from the heat generating component and transferring the absorbed heat to a second heat sink; and the second heat sink mounted on an inward-facing side of the second set of fans and cooled by the high-pressure airflow.

14 Claims, 9 Drawing Sheets

(58) Field of Classification Search
CPC ........... H05K 7/20727; H05K 7/20809; H05K 7/20336; H05K 7/20772; H05K 7/20154; H05K 7/20736; H05K 7/20172; H05K 7/1487; H05K 1/0203; H05K 5/0217; H05K 7/1489; H05K 7/20136; H05K 7/20145; H05K 7/20163; H05K 7/2019; H05K 7/20581; H05K 7/206; H05K 7/20818; H05K 7/20909; H05K 7/20972; H05K 9/0041; H05K 7/20863; H05K 7/20881; F28D 15/0275; F28D 2021/0031; F28D 1/05325; F04D 25/166; F28F 1/126; F28F 2280/00; G11B 33/142
See application file for complete search history.

(56) References Cited

U.S. PATENT DOCUMENTS

| | | | | |
|---|---|---|---|---|
| 5,986,882 | A * | 11/1999 | Ekrot | H05K 7/20809 361/679.48 |
| 6,174,841 | B1 * | 1/2001 | Yamada | C10M 111/04 257/713 |
| 6,888,725 | B2 | 5/2005 | Kubo | H01L 23/467 361/719 |
| 7,142,424 | B2 * | 11/2006 | Malone | F28F 13/06 361/679.48 |
| 8,564,951 | B1 * | 10/2013 | Watanabe | G06F 1/20 165/185 |
| 9,261,310 | B2 | 2/2016 | Fried | |
| 9,910,231 | B2 | 3/2018 | Kelty | |
| 10,349,561 | B2 | 7/2019 | Farshchian | |
| 10,571,199 | B2 | 2/2020 | Chang | |
| 2002/0036890 | A1 | 3/2002 | Furuya | |
| 2004/0070949 | A1 * | 4/2004 | Oikawa | H05K 7/20154 165/104.33 |
| 2005/0047086 | A1 * | 3/2005 | Gedamu | H05K 7/20727 257/E23.099 |
| 2005/0061485 | A1 * | 3/2005 | Hirafuji | F28D 15/0275 257/E23.103 |
| 2005/0231913 | A1 * | 10/2005 | Malone | H05K 7/20727 361/698 |
| 2005/0241802 | A1 * | 11/2005 | Malone | H05K 7/20736 165/80.4 |
| 2005/0241810 | A1 * | 11/2005 | Malone | F04D 25/166 165/122 |
| 2006/0012955 | A1 * | 1/2006 | Vinson | H05K 7/20727 361/695 |
| 2006/0262505 | A1 | 11/2006 | Cheng | |
| 2007/0070604 | A1 * | 3/2007 | Tomioka | F28D 1/05325 165/80.4 |
| 2008/0123298 | A1 | 5/2008 | Takeguchi | |
| 2009/0025909 | A1 | 1/2009 | Huang | |
| 2009/0168331 | A1 * | 7/2009 | Fujiwara | G06F 1/203 361/679.47 |
| 2010/0097760 | A1 * | 4/2010 | Azar | H05K 7/20145 361/689 |
| 2010/0177477 | A1 | 7/2010 | Cheng | |
| 2010/0300652 | A1 | 12/2010 | Lee | |
| 2011/0164384 | A1 * | 7/2011 | Vogel | F28D 1/024 165/122 |
| 2011/0464384 | | 7/2011 | Vogel | |
| 2012/0047917 | A1 | 3/2012 | Rafalovich | |
| 2013/0000122 | A1 * | 1/2013 | Yang | F28D 15/0233 29/890.032 |
| 2013/0141865 | A1 | 6/2013 | Wu | |
| 2013/0155622 | A1 | 6/2013 | Chang | |
| 2013/0329357 | A1 * | 12/2013 | Degner | H05K 5/02 165/104.21 |
| 2014/0160679 | A1 | 6/2014 | Kelty | |
| 2014/0198438 | A1 | 7/2014 | Aurongzeb | |
| 2014/0268550 | A1 * | 9/2014 | Kinstle | H05K 7/20809 361/679.48 |
| 2014/0268553 | A1 * | 9/2014 | Van Pelt | H05K 7/20709 361/679.52 |
| 2014/0321056 | A1 * | 10/2014 | Yoshikawa | H05K 7/20818 361/690 |
| 2015/0212556 | A1 * | 7/2015 | Hrehor, Jr | H05K 7/20336 361/679.48 |
| 2016/0007501 | A1 * | 1/2016 | Nakanishi | F28D 15/0275 165/103 |
| 2016/0018139 | A1 | 1/2016 | Olsson | |
| 2017/0127573 | A1 * | 5/2017 | Hirai | H05K 7/20809 |
| 2018/0292145 | A1 * | 10/2018 | Sun | F28D 15/0275 |
| 2018/0372419 | A1 * | 12/2018 | Liu | F28D 15/0275 |
| 2019/0203983 | A1 | 7/2019 | Jeon | |

FOREIGN PATENT DOCUMENTS

| | | |
|---|---|---|
| CN | 205384573 U | 7/2016 |
| CN | 205809805 U | 12/2016 |
| CN | 205810782 U | 12/2016 |

* cited by examiner

COOLING SYSTEM

CROSS-REFERENCE TO RELATED APPLICATIONS

This application is a continuation of U.S. patent application Ser. No. 16/242,845, titled "Cooling System," filed on Jan. 8, 2019, which in turn claims priority to Chinese Patent Application 201711088430.3, filed on Nov. 8, 2017. The disclosures of these applications are hereby incorporated by reference in their entirety.

TECHNICAL FIELD

The present disclosure relates to autonomous driving technology, and more particularly, to a cooling system.

BACKGROUND

Currently, in order to achieve autonomous driving of a vehicle, typically one or even more vehicle-mounted computer servers for decision making and controlling are provided on such vehicle. As complicated techniques are involved in autonomous driving, it is desired that the vehicle-mounted computer servers could have more powerful functions, with not only high computing capabilities and high processing efficiencies, but also capabilities of running stably for a long time (e.g., high anti-vibration capability and excellent cooling effect). Hence, compared with ordinary computer servers, a vehicle-mounted computer server may have a larger number of components to be installed therein, e.g., a number of sets of core components, such as a number of Central Processing Units (CPUs), a number of Graphics Processing Units (GPUs), a number of expansion cards, one or more power sources, and the like.

Due to a limited space in a vehicle, these core components may typically be arranged densely and compactly in a case having a limited space. However, some components (referred to as "heat generating components" hereinafter) will generate heat during their operation. A heat generating component may malfunction as its temperature increases. Thus, it is desired to dissipate the heat generated by the heat generating component timely, so as to ensure that the core component can function normally.

SUMMARY

According to some embodiments of the present disclosure, a cooling system is provided. The cooling system includes: a first set of fans mounted on an inward-facing side of an air inlet on an outer shell of a case; a second set of fans mounted on an inward-facing side of an air outlet on the outer shell of the case, for generating, in cooperation with the first set of fans, a high-pressure airflow from the air inlet to the air outlet; a first heat sink connected to a heat generating component in the case, for absorbing heat from the heat generating component and transferring the absorbed heat to a second heat sink; and the second heat sink mounted on an inward-facing side of the second set of fans and cooled by the high-pressure airflow.

BRIEF DESCRIPTION OF THE DRAWINGS

The figures are provided for facilitating further understanding of the present disclosure. The figures constitute a portion of the description and can be used in combination with the embodiments of the present disclosure to interpret, rather than limiting, the present disclosure. In the figures.

DETAILED DESCRIPTION OF THE EMBODIMENTS

In the following, the solutions according to the embodiments of the present disclosure will be described clearly and completely with reference to the figures, such that the solutions can be better understood by those skilled in the art. Obviously, the embodiments described below are only some, rather than all, of the embodiments of the present disclosure. All other embodiments that can be obtained by those skilled in the art based on the embodiments described in the present disclosure without any inventive efforts are to be encompassed by the scope of the present disclosure.

The present disclosure provides a cooling system, capable of cooling a heat generating component in a computer server quickly, so as to ensure that the heat generating component can function stably. With the cooling system according to the present disclosure, a first heat sink may transfer the heat generated by the heat generating component directly to the second heat sink, and then the first set of fans and the second set of fans generate a high-pressure airflow for cooling the second heat sink. With the cooling system according to the present disclosure, on one hand, the first heat sink may transfer the heat generated by the heat generating component directly and quickly to the second heat sink, so as to increase the speed of heat dissipation and ensure that the heat generating component may function stably. On the other hand, the second heat sink is arranged near the air outlet on the outer shell of the case, such that the high-pressure airflow may dissipate the heat on the second heat sink quickly to the outside of the case, thereby further increasing the speed of heat dissipation and improving the cooling effect.

The cooling system according to the embodiment of the present disclosure may be applied to a vehicle-mounted computer server in an unmanned vehicle, a computer server in an unmanned plane, a computer server in an unmanned ship, a robot, or any other computer servers for which heat dissipation is desired. The present disclosure is not limited to any specific application scenario.

Figure 1:
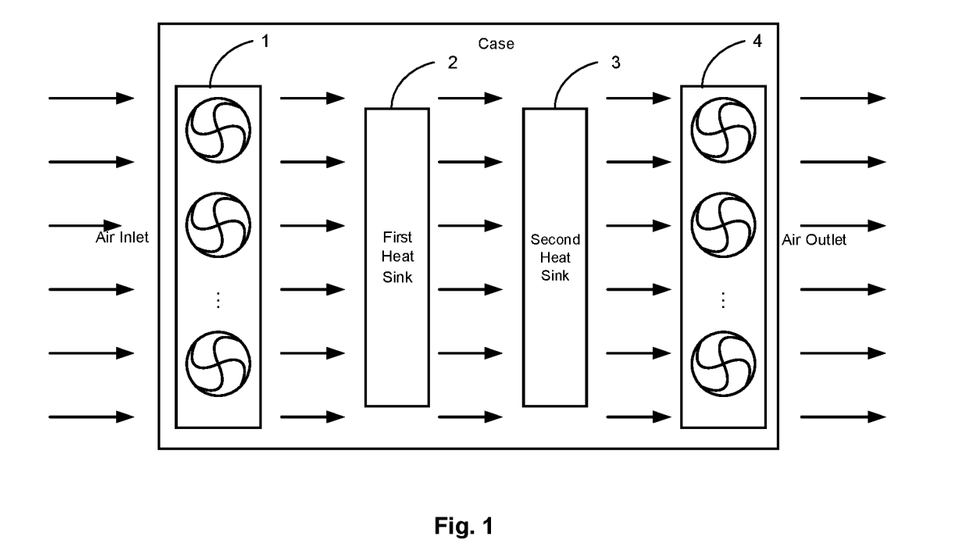
FIG. 1 is a schematic diagram showing a structure of a cooling system according to some embodiments of the present disclosure.

Referring to FIG. 1, which is a schematic diagram showing a structure of a cooling system according to an embodiment of the present disclosure, the cooling system is provided within a case including a heat generating component. An air inlet and an air outlet are provided on two panels on opposite sides of an outer shell of the case, respectively. The cooling system includes a first set of fans 1, a first heat sink 2, a second heat sink 3 and a second set of fans 4.

The first set of fans 1 is mounted on an inward-facing side of the air inlet on the outer shell of the case.

The second set of fans 4 is mounted on an inward-facing side of the air outlet on the outer shell of the case, for generating, in cooperation with the first set of fans 1, a high-pressure airflow from the air inlet to the air outlet.

The first heat sink 2 is connected to the heat generating component in the case, for absorbing heat from the heat generating component and transferring the absorbed heat to the second heat sink 3.

The second heat sink 3 is mounted on an inward-facing side of the second set of fans 4 and cooled by the high-pressure airflow.

Figure 2A:
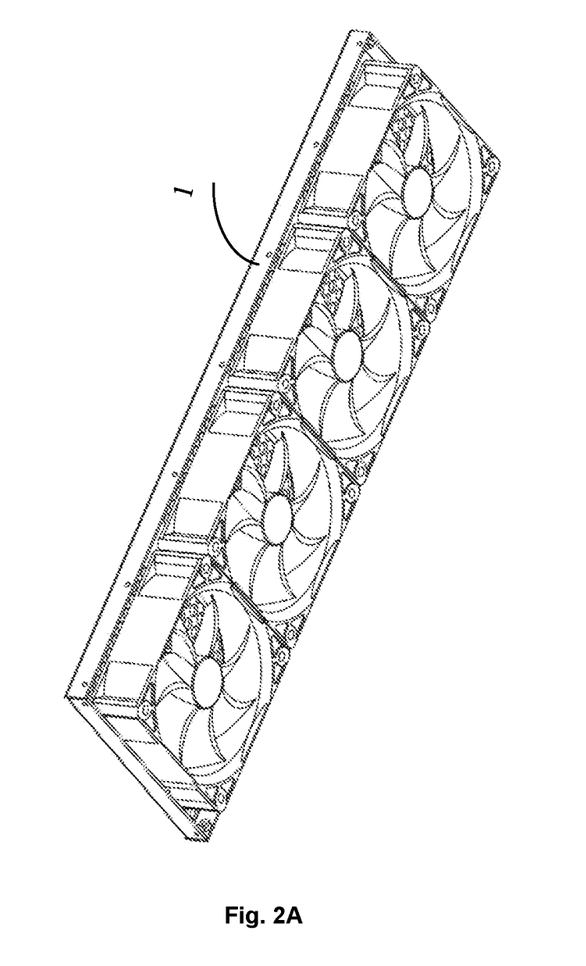
FIG. 2A and FIG. 2B are schematic diagrams showing a structure of a first set of fans and a structure of a second set of fans, respectively.
Figure 2B:
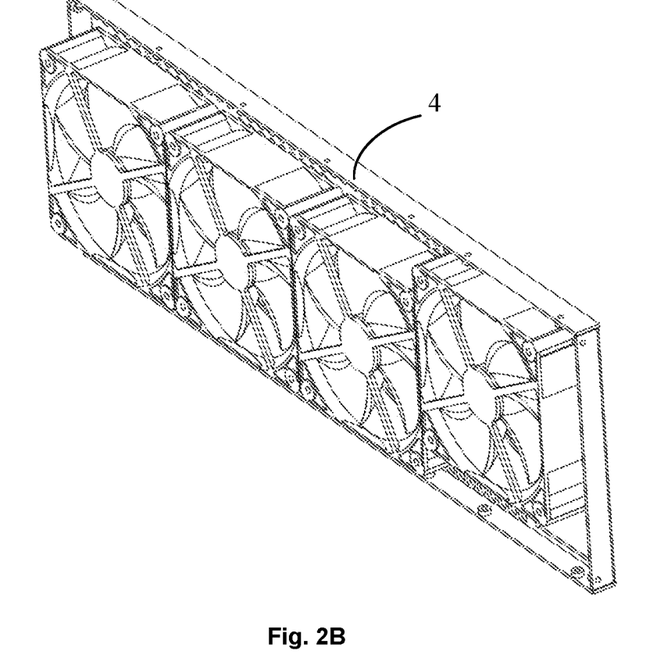

In some embodiments of the present disclosure, the first set of fans 1 and the second set of fans 4 may each include a plurality of fans. The number of fans in each set may be configured flexibly depending on actual requirements. For example, the more components for which heat dissipation is desired, or the larger the space for which heat dissipation is desired, the more fans may to be mounted. FIG. 2A is a schematic diagram showing a structure of the first set of fans 1. FIG. 2B is a schematic diagram showing a structure of the second set of fans 4. In FIGS. 2A and 2B, the first set of fans 1 and the second set of fans 4 each include four fans.

In some embodiments of the present disclosure, the second heat sink 3 may be configured as cooling fins formed in one piece, or a plurality of sets of cooling fins. This may be configured flexibly by those skilled in the art depending on actual requirements and the present disclosure is not limited to any of these configurations.

In some embodiments of the present disclosure, the first heat sink 2 may have any of the following structures.

Structure 1: The first heat sink 2 includes a plurality of sets of heat pipes 21, each set of heat pipes 21 corresponding to one heat generating component.

Structure 2: The first heat sink 2 includes a plurality of turbofan heat sinks 22 each corresponding to one heat generating component.

Structure 3: The first heat sink 2 includes at least one water cooling device 23 each corresponding to a plurality of heat generating components.

Structure 4: The first heat sink 2 includes at least one set of heat pipes 21 and at least one turbofan heat sink 22, each set of heat pipes 21 corresponding to one heat generating component and each turbofan heat sink 22 corresponding to one heat generating component.

Structure 5: The first heat sink 2 includes at least one set of heat pipes 21 and at least one water cooling device 23, each set of heat pipes 21 corresponding to one heat generating component and each water cooling device 23 corresponding to a plurality of heat generating components.

Structure 6: The first heat sink 2 includes at least one turbofan heat sink 22 and at least one water cooling device 23, each turbofan heat sink 22 corresponding to one heat generating component and each water cooling device 23 corresponding to a plurality of heat generating components.

Structure 7: The first heat sink 2 includes at least one set of heat pipes 21, at least one turbofan heat sink 22 and at least one water cooling device 23, each set of heat pipes 21 corresponding to one heat generating component, each turbofan heat sink 22 corresponding to one heat generating component and each water cooling device 23 corresponding to a plurality of heat generating components.

In the following, the above Structures 1, 2 and 3 will be described in detail with reference to the figures, such that the structures of the above heat pipe 21, turbofan heat sink 22 and water-cooling device 23 can be better understood by those skilled in the art.

Embodiment 1

Figure 3A:
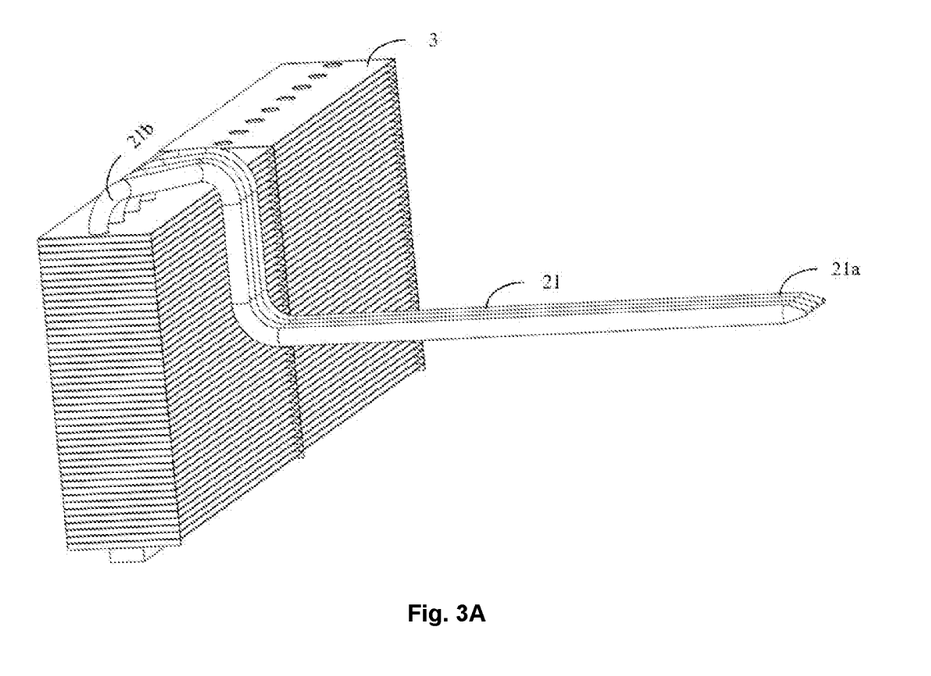
FIG. 3A is a schematic diagram showing a structure of a first heat sink including a plurality of sets of heat pipes according to some embodiments of the present disclosure.

Referring to FIG. 3A, which is a schematic diagram showing an exemplary structure of a first heat sink 2 according to an embodiment of the present disclosure, the first heat sink 2 includes a plurality of sets of heat pipes 21. Each set of heat pipes 21 corresponds to one heat generating component, and includes at least one heat pipe each having one end 21a connected to the one heat generating component and another end 21b connected to the second heat sink.

In an embodiment of the present disclosure, for different heat generating components, different numbers of heat pipes may be included in their corresponding sets of heat pipes. For example, the higher the power of the heat generating component is, the larger number of heat pipes its corresponding set of heat pipes will include. For example, each GPU may correspond to a set of four copper heat pipes each having a diameter of 8 mm.

In order to further increase the contact area between the heat pipes and the heat generating component and thus the speed at which the heat pipes absorb the heat, in an embodiment of the present disclosure, the heat generating component may have its surface coated with a layer of thermally conductive silicone grease. The one end 21a of each heat pipe in each set of heat pipes may be connected to the heat generating component via a first mounting device.

Figure 3B:
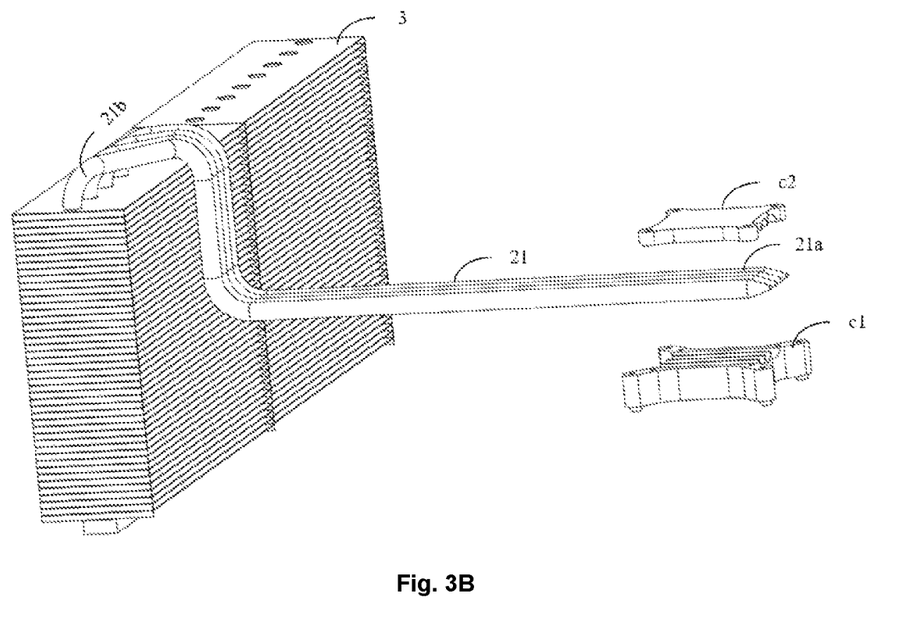
FIG. 3B is a schematic diagram showing a structure of a first mounting device according to some embodiments of the present disclosure.
Figure 3C:
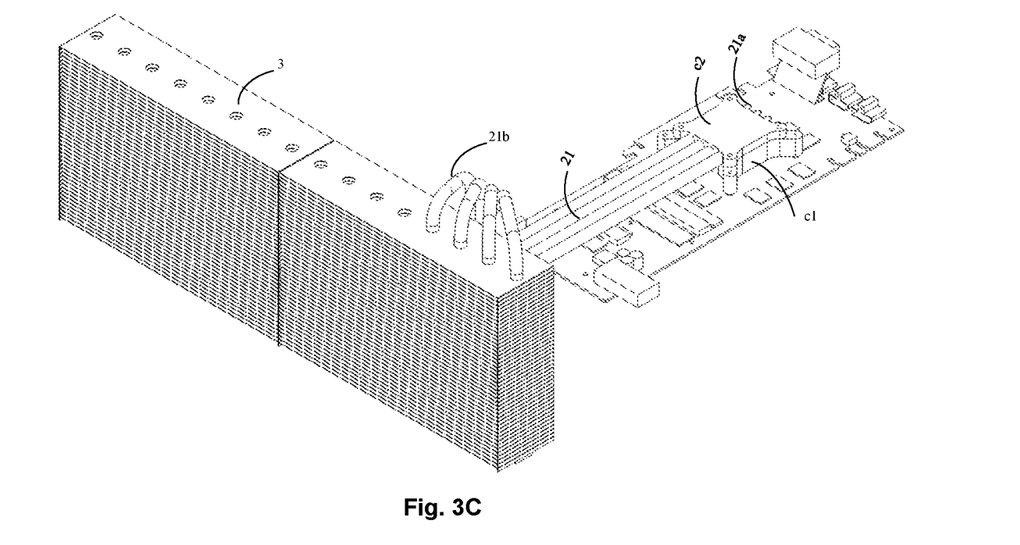
FIG. 3C is a schematic diagram showing a heat pipe mounted on a heat generating component via a first mounting device according to some embodiments of the present disclosure.

In an example, the first mounting device may have a structure shown in FIG. 3B. As shown, the first mounting device includes a heat pipe base c1 and a heat pipe cover c2. The heat pipe base c1 is mounted fixedly on the thermally conductive silicone grease for the heat generating component, and has a plurality of grooves or slots provided on its top for mounting the heat pipes. The one end 21a of each heat pipe in each set of heat pipes is pressed tightly onto the heat pipe base c1 by the heat pipe cover c2, as shown in FIG. 3C. The heat pipe base c1 and the heat pipe cover c2 may be fastened to each other by screws or bolts.

Figure 3D:
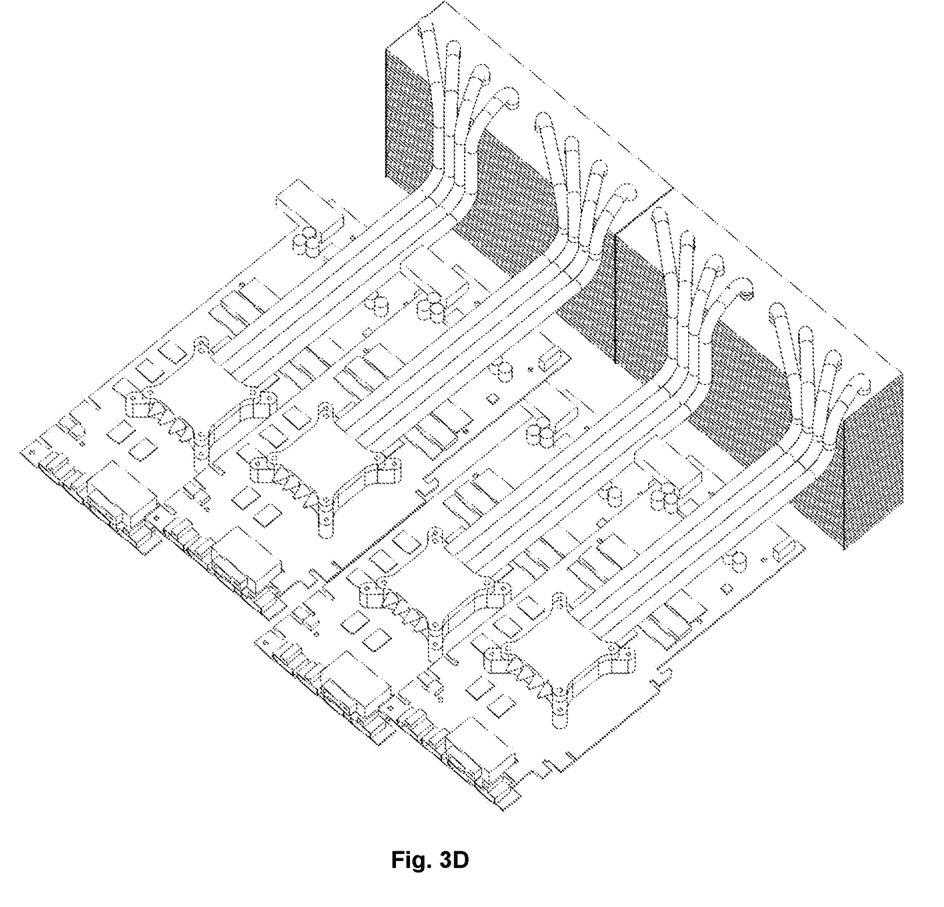
FIG. 3D is a schematic diagram showing a plurality of sets of heat pipes provided on respective heat generating components according to some embodiments of the present disclosure.

FIG. 3D is a schematic diagram showing a structure in which a plurality of sets of heat pipes are provided on respective heat generating components.

Figure 3E:
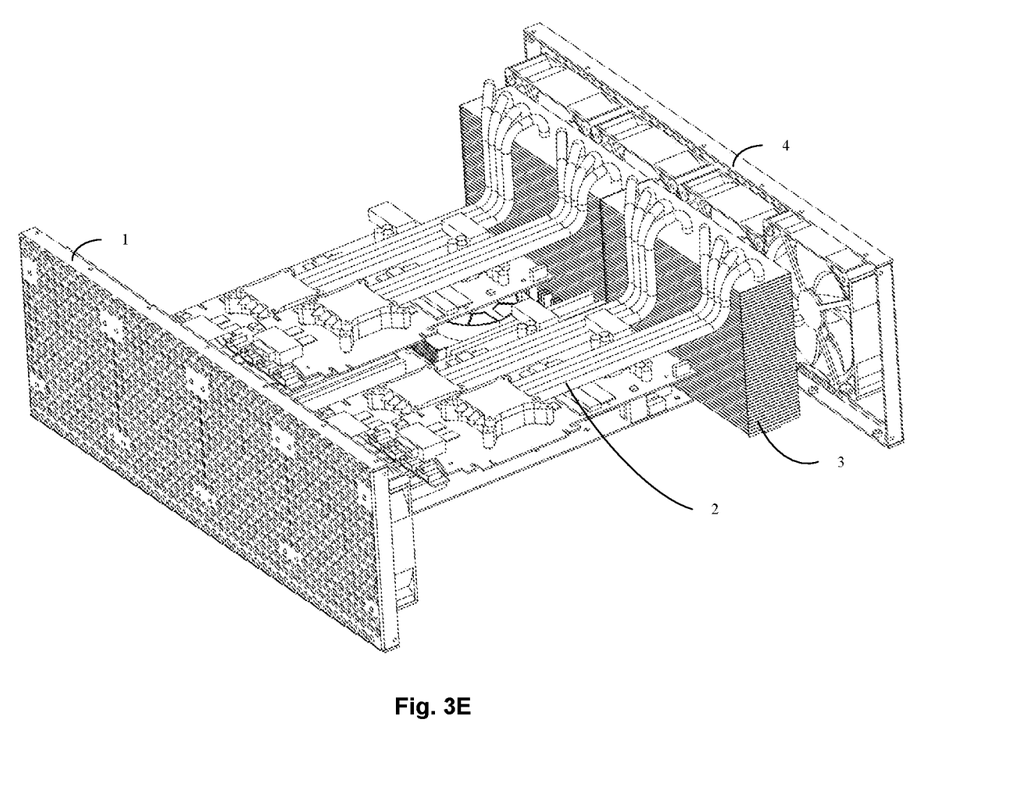
FIG. 3E is a schematic diagram showing a structure of a cooling system according to some embodiments of the present disclosure.

FIG. 3E is a schematic diagram showing a structure of a cooling system including a first set of fans 1, a first heat sink 2, a second heat sink 3 and a second set of fans 4.

Of course, in another example, the first mounting device may include a heat pipe base and a heat pipe cover. The heat pipe base is mounted fixedly on the thermally conductive silicone grease for the heat generating component, and the heat pipe cover has at least one groove or slot provided at its bottom for mounting the at least one heat pipe. The one end 21a of each heat pipe in each set of heat pipes is pressed tightly onto the heat pipe base by the heat pipe cover. The heat pipe base and the heat pipe cover may be fastened to each other by screws or bolts.

Of course, in another example, the first mounting device may include a heat pipe base, which is mounted fixedly on the thermally conductive silicone grease for the heat generating component. The one end 21a of each heat pipe in each set of heat pipes is welded to the heat pipe base.

In order to further increase the speed of heat dissipation, in an embodiment of the present disclosure, each of the heat pipe cover c2 and the heat pipe base c1 of the above first mounting device may have its surface coated uniformly with a layer of thermally conductive silicone grease, and/or the one end 21a of the heat pipe may have its surface coated uniformly with a layer of thermally conductive silicone grease.

In an embodiment of the present disclosure, the heat pipe may include a pipe shell, a wick within the pipe shell and a pipe cover for sealing the pipe shell. The pipe shell may be filled with a volatile liquid having a low boiling point.

In an embodiment of the present disclosure, the wick may be made of a porous material.

In an embodiment of the present disclosure, air may be drawn out to form a negative pressure of $1.3*10^{-1} \sim 1.3*10^{-4}$ Pa inside the pipe shell and then the pipe shell may be filled with the volatile liquid having the low boiling point. When the wick is filled with the liquid, the pipe shell is sealed with the pipe cover.

The principle of the heat pipe absorbing the heat from the heat generating component and transferring the absorbed heat to the second heat sink 3 may be as follows. When the one end 21a of the heat pipe is heated, the liquid in the wick is vaporized into vapor and the heat generated by the heat generating component may be absorbed during the vaporization of the liquid. The vapor flows towards the other end 21b of the heat pipe, subject to a small pressure, and is liquefied into a liquid when meeting the second heat sink 3 having a relatively low temperature at the other end 21b (as the second heat sink 3 is continuously cooled by the high-pressure airflow, it has a lower temperature than the heat pipe). During the liquefaction of the vapor, heat is released to the second heat sink 3. The liquid flows back to the one end 21a, subject to a capillary force of the wick. Cyclically in this way, the heat generated by the heat generating component may be transferred to the second heat sink 3.

In an embodiment of the present disclosure, the material of the heat pipe and the type of the liquid may be any of the following: 1) the pipe shell of the heat pipe may be made of copper and the liquid may be water; 2) the pipe shell of the heat pipe may be made of carbon steel and the liquid may be water; 3) the pipe shell of the heat pipe may be made of a composite of steel and copper and the liquid may be water; 4) the pipe shell of the heat pipe may be made of aluminum and the liquid may be acetone; or 5) the pipe shell of the heat pipe may be made of stainless steel and the liquid may be sodium.

In an embodiment of the present disclosure, the other end 21b of each heat pipe in each set of heat pipes may be connected to the second heat sink 3 by means of welding.

Preferably, in an embodiment of the present disclosure, the heat pipe may have a shape of a prism, e.g., a cylinder or cuboid, and the present disclosure is not limited thereto.

Embodiment 2

Figure 4A:
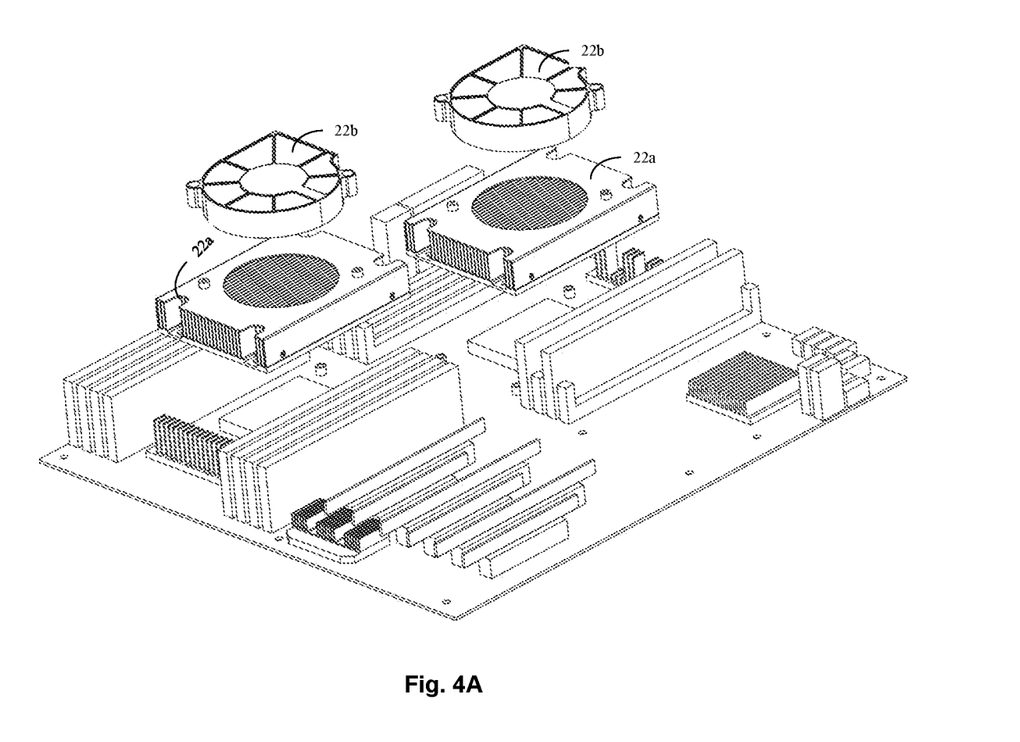
FIG. 4A and FIG. 4B are schematic diagrams each showing a structure of a first heat sink including a turbofan heat sink according to some embodiments of the present disclosure.
Figure 4B:
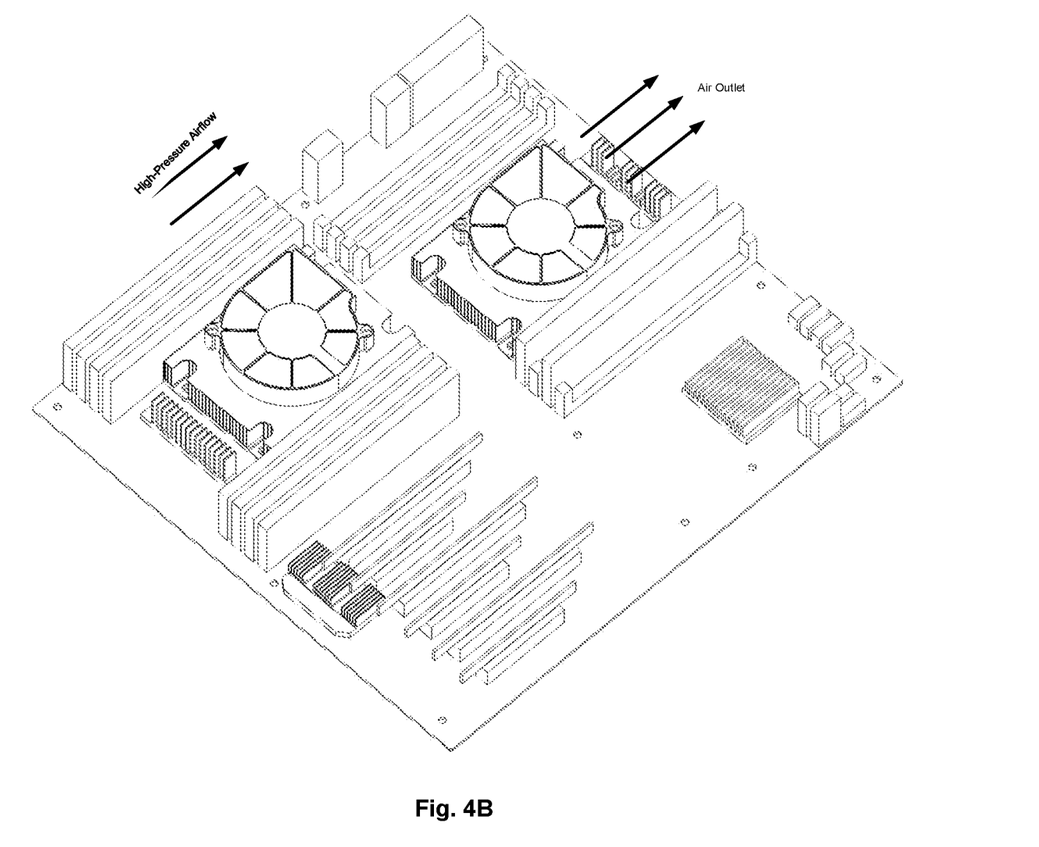

Referring to FIG. 4A, which shows another exemplary structure of a first heat sink 2 according to an embodiment of the present disclosure, the first heat sink 2 includes a plurality of turbofan heat sinks 22 each corresponding to one heat generating component. Each of the plurality of turbofan heat sinks 22 includes a cooling fin 22a connected to the heat generating component and a turbofan 22b. The turbofan 22b has an air outlet facing a same direction as the high-pressure airflow. The turbofan 22b draws air to blow heat on the cooling fin 22a to the second heat sink 3, as shown in FIG. 4B.

In order to further increase the contact area between the turbofan heat sink 22 and the heat generating component and thus the speed at which the heat is absorbed, in an embodiment of the present disclosure, the heat generating component may have its surface coated with a layer of thermally conductive silicone grease. The cooling fin 22a of the turbofan heat sink 22 may be mounted fixedly on the thermally conductive silicone grease for the heat generating component.

Embodiment 3

Figure 5:
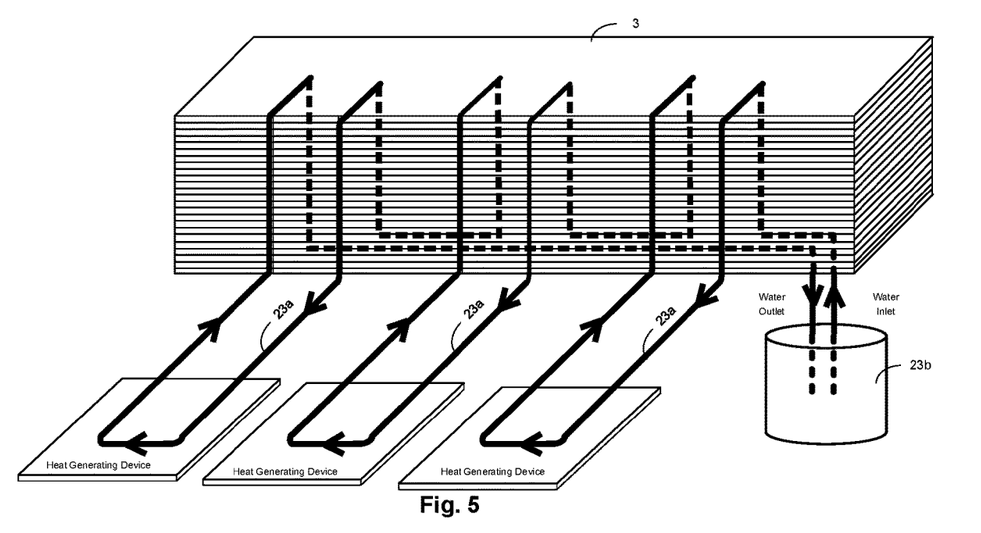
FIG. 5 is a schematic diagram showing a structure of a first heat sink including a water cooling device according to some embodiments of the present disclosure.

Referring to FIG. 5, which shows another exemplary structure of a first heat sink 2 according to an embodiment of the present disclosure, the first heat sink 2 includes at least one water cooling device each including a water cooling pipe 23a and a water tank 23b arranged cyclically. The water-cooling pipe 23a has a water inlet and a water outlet each connected to the water tank 23b. Water in the water-cooling pipe 23a, when flowing through one heat generating component, carries heat generated by the one heat generating component to the second heat sink 3 and then flows from the second heat sink 3 and through a next heat generating component.

In an embodiment of the present disclosure, the heat generating component may have its surface coated with a layer of thermally conductive silicone grease. The water-cooling pipe 23a may be mounted on the thermally conductive silicone grease for the heat generating component via a second mounting device. The water-cooling pipe 23a may be twisted spirally around the second heat sink 3, or may be arranged in the second heat sink 3 in a Li-shaped structure (as shown in FIG. 5). The present disclosure is not limited to any of these arrangements. Here, the second mounting device may include a heat pipe base and a heat pipe cover. The heat pipe base may be mounted on the thermally conductive silicone grease for the heat generating component and have at least one groove or slot provided on its top for mounting the at least one water cooling pipe 23a (the groove may be Li-shaped, L-shaped or V-shaped and the present disclosure is not limited to any of these shapes). The water-cooling pipe 23a may be pressed tightly onto the heat pipe base by the heat pipe cover. The structure of the second mounting device may be identical to, or similar with, that of the first mounting device and details thereof will be omitted here.

In order to further increase the speed of heat dissipation, in an embodiment of the present disclosure, each of the heat pipe cover and the heat pipe base of the above second mounting device may have its surface coated uniformly with a layer of thermally conductive silicone grease, and/or one end of the water-cooling pipe 23a that is connected to the heat generating component may have its surface coated uniformly with a layer of thermally conductive silicone grease.

Embodiment 4

According to an embodiment of the present disclosure, in a further example of a first heat sink 2, the first heat sink 2 includes at least one set of heat pipes 21 and at least one turbofan heat sink 22, each set of heat pipes 21 corresponding to one heat generating component and each turbofan heat sink 22 corresponding to one heat generating component. For the structures of the heat pipe 21 and the turbofan heat sink 22, reference can be made to the above embodiments and details thereof will be omitted here.

For example, some of the heat generating components in the case may each have a turbofan heat sink 22 provided thereon and some of the heat generating components in the case may each have heat pipes 21 provided thereon. For example, each CPU on a motherboard may correspond to a turbofan heat sink 22, each GPU on a graphics card may correspond to a set of heat pipes 21, and each power source may correspond to a set of heat pipes 21. As another example, each CPU on a motherboard may correspond to a set of heat pipes 21 and each GPU on a graphics card may correspond to a turbofan heat sink 22. As yet another example, some of CPUs on a motherboard may correspond to a set of heat pipes 21 while some of the CPUs may correspond to a turbofan heat sink 22, and some of GPUs on a graphics card can correspond to a set of heat pipes 21 while some of the GPUs may correspond to a turbofan heat sink 22. This can be selected flexibly by those skilled in the art depending on actual requirements and the present disclosure is not limited thereto.

Figure 6:
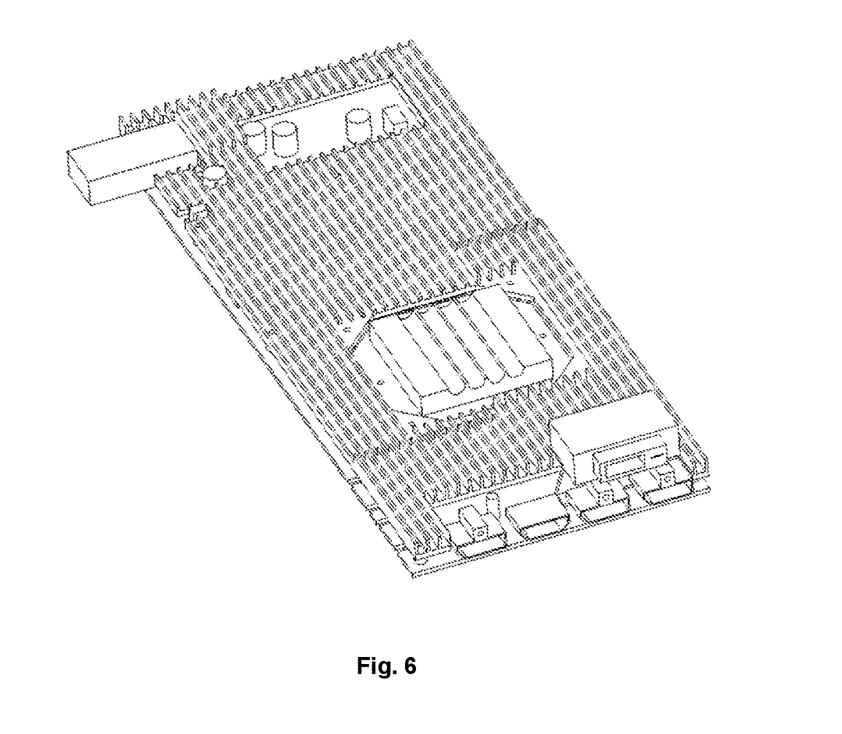
FIG. 6 is a schematic diagram showing a layer of cooling fins provided on a surface of a graphics card according to some embodiments of the present disclosure.

In order to further improve the efficiency of heat dissipation, in an embodiment of the present disclosure, a layer of cooling fins may be provided on a surface of a motherboard, for absorbing heat generated by other components on the motherboard. Additionally or alternatively, a layer of cooling fins may be provided on a surface of a graphics card, for absorbing heat generated by other components on the graphics card. The layer of cooling fins provided on the surface of the motherboard and the layer of cooling fins provided on the surface of the graphics card may be cooled using a high-pressure airflow. As shown in FIG. 6, a layer of cooling fins is provided on a surface of a graphics card.

While the embodiments of the present disclosure have been described above, further alternatives and modifications can be made to these embodiments by those skilled in the art in light of the basic inventive concept of the present disclosure. The claims as attached are intended to cover the above embodiments and all these alternatives and modifications that fall within the scope of the present disclosure.

Obviously, various modifications and variants can be made to the present disclosure by those skilled in the art without departing from the spirit and scope of the present disclosure. Therefore, these modifications and variants are to be encompassed by the present disclosure if they fall within the scope of the present disclosure as defined by the claims and their equivalents.

What is claimed is:

1. A cooling system, comprising:
   a first set of fans mounted on an inward-facing side of an air inlet on an outer shell of a case;
   a second set of fans mounted on an inward-facing side of an air outlet on the outer shell of the case, for generating, in cooperation with the first set of fans, an airflow from the air inlet to the air outlet;
   a first heat transfer device connected to a heat generating component of a plurality of heat generating components in the case, for absorbing heat from the heat generating component and transferring the absorbed heat to a second heat transfer device; and
   the second heat transfer device mounted on an inward-facing side of the second set of fans and cooled by the airflow, wherein the second heat transfer device is a heat sink and comprises a first surface facing the heat generating component and a second surface opposite the first surface and facing the second set of fans.

2. The system of claim 1, wherein the first heat transfer device comprises a plurality of sets of heat pipes, each set of heat pipes corresponding to one of the plurality of heat generating components and comprising a heat pipe having one end connected to the one heat generating component and another end connected to the second heat transfer device.

3. The system of claim 1, wherein the heat generating component of the plurality of heat generating components has its surface coated with a layer of thermally conductive silicone grease, and
   the first heat transfer device comprises a heat pipe having one end connected to the heat generating component via a first mounting device,
   wherein the first mounting device comprises a heat pipe base and a heat pipe cover, the heat pipe base being mounted fixedly on the thermally conductive silicone grease for the heat generating component, and the heat pipe cover having a groove or slot provided on its bottom for mounting the heat pipe, and wherein the one end of the heat pipe is pressed tightly onto the heat pipe base by the heat pipe cover.

4. The system of claim 1, wherein the first heat transfer device comprises a heat pipe, and the heat pipe comprises a pipe shell, a wick within the pipe shell and a pipe cover for sealing the pipe shell, the pipe shell being filled with a volatile liquid having a low boiling point.

5. The system of claim 2, wherein the other end of the heat pipe in each set of heat pipes is connected to the second heat transfer device by means of welding.

6. The system of claim 4, wherein the heat pipe is formed by:
   drawing out air from the pipe shell to form a negative pressure inside the pipe shell;
   filling the pipe shell and the wick with the volatile liquid having the low boiling point; and
   sealing the pipe shell with the pipe cover.

7. The system of claim 6, wherein the heat pipe has one end connected to the heat generating component and another end connected to the second heat transfer device,
   wherein the volatile liquid in the wick is configured to vaporize when the end of the heat pipe connected to the heat generating component absorbs heat from the heat generating component,
   wherein the heat pipe is configured so that vaporized volatile liquid flows towards the end of the heat pipe connected to the second heat transfer device and becomes a liquid when meeting the second heat transfer device, or
   wherein the volatile liquid is configured to release heat to the second heat transfer device when becoming a liquid, and the wick is configured to have a capillary force so that the liquified volatile liquid flows from the end of the heat pipe connected to the second heat transfer device to the end of the heat pipe connected to the first heat transfer device.

8. The system of claim 1, wherein the first heat transfer device comprises a heat pipe, the second heat transfer device further comprises a third surface between the first surface and the second surface, and the heat pipe is connected to the second heat transfer device at the third surface.

9. The system of claim 4, wherein the wick is made of porous material.

10. A method for making a cooling system, comprising:
providing a first set of fans mounted on an inward-facing side of an air inlet on an outer shell of a case;
providing a second set of fans mounted on an inward-facing side of an air outlet on the outer shell of the case, for generating, in cooperation with the first set of fans, an airflow from the air inlet to the air outlet;
providing a first heat transfer device connected to a heat generating component of a plurality of heat generating components in the case, for absorbing heat from the heat generating component and transferring the absorbed heat to a second heat transfer device; and
providing the second heat transfer device mounted on an inward-facing side of the second set of fans and cooled by the airflow, wherein the second heat transfer device is a heat sink and comprises a first surface facing the heat generating component and a second surface opposite the first surface and facing the second set of fans.

11. The method of claim 10, wherein the first heat transfer device comprises a plurality of sets of heat pipes, each set of heat pipes corresponding to one of the plurality of heat generating components and comprising a heat pipe having one end connected to the one heat generating component and another end connected to the second heat transfer device, the heat pipe comprising a pipe shell, a wick within the pipe shell, and a pipe cover for sealing the pipe shell, the pipe shell being filled with a volatile liquid having a low boiling point, the method further comprising:

drawing out air from the pipe shell to form a negative pressure inside the pipe shell;
filling the pipe shell and the wick with the volatile liquid having the low boiling point; and
sealing the pipe shell with the pipe cover.

12. The method of claim 11, wherein the volatile liquid in the wick is configured to vaporize when the end of the heat pipe connected to the one heat generating component absorbs heat from the one heat generating component,
wherein the heat pipe is configured so that vaporized volatile liquid flows towards the end of the heat pipe connected to the second heat transfer device and becomes a liquid when meeting the second heat transfer device, or
wherein the volatile liquid is configured to release heat to the second heat transfer device when becoming a liquid, and the wick is configured to have a capillary force so that the liquified volatile liquid flows from the end of the heat pipe connected to the second heat transfer device to the end of the heat pipe connected to the first heat transfer device.

13. The method of claim 10, wherein the first heat transfer device comprises a heat pipe, the second heat transfer device further comprises a third surface between the first surface and the second surface, and the heat pipe is connected to the second heat transfer device at the third surface.

14. The method of claim 11, wherein the wick is made of porous material.

* * * * *

UNITED STATES PATENT AND TRADEMARK OFFICE
CERTIFICATE OF CORRECTION

PATENT NO. : 11,632,880 B2
APPLICATION NO. : 17/217817
DATED : April 18, 2023
INVENTOR(S) : Zhihua Ma It is certified that error appears in the above-identified patent and that said Letters Patent is hereby corrected as shown below:

In the Specification

• In Column 1, Line 8, delete "2019," and insert -- 2019, now Pat. No. 10,973,152, --, therefor.

• In Column 3, Line 38, delete "to be" and insert -- be --, therefor.

• In Column 5, Line 26, delete "$1.3*10^{-1} \sim 1.3*10^{-4}$" and insert -- $1.3*10^{-1} \sim 1.3*10^{-4}$ --, therefor.

Signed and Sealed this
Thirteenth Day of June, 2023

Katherine Kelly Vidal
*Director of the United States Patent and Trademark Office*